United States Patent [19]

McAdams

[11] Patent Number: 5,353,250

[45] Date of Patent: Oct. 4, 1994

[54] PIN PROGRAMMABLE DRAM THAT PROVIDES CUSTOMER OPTION PROGRAMMABILITY

[75] Inventor: Hugh P. McAdams, McKinney, Tex.

[73] Assignee: Texas Instruments Inc., Dallas, Tex.

[21] Appl. No.: 154,371

[22] Filed: Nov. 16, 1993

Related U.S. Application Data

[63] Continuation of Ser. No. 805,355, Dec. 9, 1991, abandoned.

[51] Int. Cl.[5] .................. G11C 13/00; H03K 17/687
[52] U.S. Cl. ................ 365/189.03; 365/63; 307/465
[58] Field of Search ............ 365/182, 51, 63, 189.03; 307/465, 469

[56] References Cited

U.S. PATENT DOCUMENTS

| | | | |
|---|---|---|---|
| 4,789,966 | 12/1988 | Ozaki .................... | 365/189 |
| 4,808,844 | 2/1989 | Ozaki et al. ............. | 307/465 X |
| 4,990,800 | 2/1991 | Lee ....................... | 307/465 |
| 5,057,712 | 10/1991 | Trinh et al. .............. | 307/465 |
| 5,161,124 | 11/1992 | Love ...................... | 361/222 |

Primary Examiner—Eugene R. LaRoche
Assistant Examiner—Son Dinh
Attorney, Agent, or Firm—Richard B. Havill; Robby T. Holland; Richard L. Donaldson

[57] ABSTRACT

The described embodiments of the present invention provide a circuit and method for selecting an organization and for programming mode options of an integrated circuit. The embodiment described provides this function for a dynamic random access memory but is applicable to any integrated circuit. The integrated circuit includes programming lead pins, connected to respective programming bond pads, which are selectably connectable to an external reference potential. Circuitry on the integrated circuit provides logical signals that select the operational organization and mode options of the integrated circuit.

4 Claims, 4 Drawing Sheets

```
      1MX4                    1MX4
┌─────────────┐         ┌─────────────┐
│ DQ1    VSS  │         │ DQ1    VSS  │
│ DQ2    DQ4  │         │ DQ2    DQ4  │
│ /WE    DQ3  │         │ /WE    DQ3  │
│ /RAS   /CAS │         │ /RAS   /CAS │
│ Q9     OE   │         │ A9     /OE  │
│             │         │ OP2    OP3  │
│             │         │             │
│             │         │ OP1    NC   │
│ A0     A8   │         │ A0     A8   │
│ A1     A7   │         │ A1     A7   │
│ A2     A6   │ PRIOR   │ A2     A6   │
│ A3     A5   │ ART     │ A3     A5   │
│ VCC    A4   │         │ VCC    A4   │
└─────────────┘         └─────────────┘
    Fig. 1                  Fig. 3a

4MX1                    4MX1
┌─────────────┐         ┌─────────────┐
│ D      VSS  │         │ D      VSS  │
│ /WE    Q    │         │ /WE    Q    │
│ /RAS   /CAS │         │ /RAS   /CAS │
│ NC     NC   │         │ NC     NC   │
│ A10    A9   │         │ A10    A9   │
│             │         │ OP2    OP3  │
│             │         │             │
│             │         │ OP1    NC   │
│ A0     A8   │         │ A0     A8   │
│ A1     A7   │         │ A1     A7   │
│ A2     A6   │         │ A2     A6   │
│ A3     A5   │ PRIOR   │ A3     A5   │
│ VCC    A4   │ ART     │ VCC    A4   │
└─────────────┘         └─────────────┘
    Fig. 2                  Fig. 3b
```

PIN PROGRAMMABLE DRAM THAT PROVIDES CUSTOMER OPTION PROGRAMMABILITY

This application is a continuation of application Ser. No. 07/805,355, filed Dec. 9, 1991, abandoned.

FIELD OF THE INVENTION

The present invention relates to the field of integrated circuit design. More specifically, the present invention relates to a pin programmable DRAM that provides option programmability to the customer at the board level.

BACKGROUND OF THE INVENTION

Integrated circuit manufacturers strive to have a wide variety of integrated circuit types to satisfy their customers' needs. Many of these different types are minor modifications of chips that are fundamentally similar. For example, 1-bit output data ($\times 1$), 4-bit output data ($\times 4$), 8-bit output data ($\times 8$), static column and page modes are available in dynamic random access memories (DRAMs). Each of these modes may help the performance of a system in its own particular way. However, fundamentally each provides the function of storing a set amount of data.

In order to expedite design time and minimize manufacturing costs, integrated circuit manufacturers have designed several mode types into a fundamental design. Some of these multiple design integrated circuits are programmed by providing different metal configurations in the last metallization step. The photomasking for this metallization step may be easily changed in the production line or partially finished integrated circuits may be stored in order to quickly perform the final masking step and quickly provide the desired integrated circuit to the customer. This has been an effective strategy in the industry, but still requires changes to be made in the relatively complicated metallization masking step of the integrated circuit fabrication process. Another draw back of this strategy is that the integrated circuit remains vulnerable to contamination until the final protective layers are over the top of the integrated circuit.

In another programming technique, bond pad programming, the programming step is moved downstream from the integrated circuit manufacturing process to the packaging step. The options desired are chosen by selectively bonding programming bond pads to Vdd or Vss. In some instances, some of the bonding pads may be left unbonded. If a pad is left unbonded, the pad is taken to a default potential on chip. The necessary reconfiguration within the chip for the desired mode of operation is accomplished through setting of logic gates and use of CMOS transfer devices. Selection at this stage of manufacturing puts the decision closer to the point of customer delivery and allows the marketing and manufacturing organizations greater flexibility in servicing the customer's needs.

The use of bond pad programming leads to an interesting possibility—letting the customer himself determine the option he wants at the point of use, his board. If a way can be found for him to do so, without increasing the cost of the device or his system costs, then there appear to be advantages for both the manufacturer and the user. Having a single device from which to source all device options solves his inventory problems for multiple device types while freeing his designers to choose the best device for the application. In both cases it simplifies the question of product mix from "how many of which kind?" to simply "how many?"

SUMMARY OF THE INVENTION

The described embodiments of the present invention provide a circuit and method for programming the mode options of an integrated circuit at the board level. The embodiments described provide this function for dynamic random access memories (DRAMs) but are applicable to any integrated circuit.

In a preferred embodiment, a 4M DRAM having a selected organization is presented which allows the customer to PIN program the mode options. The selected organization may include $4M \times 1$ and $1M \times 4$ formats. The choice of mode function includes page, nibble, SCD and serial. Having a single device from which to source all device options solves a customer's inventory problems for multiple device types, while freeing his designers to choose the best device for the application.

BRIEF DESCRIPTION OF THE DRAWINGS

The novel features believed characteristic of the invention are set forth in the appended claims. The invention it self, however, as well as other features and advantages thereof, will be best understood by reference to the detailed description which follows, read in conjunction with the accompanying drawings, wherein:

FIG. 1 is a pinout of a $1M \times 4$ DRAM utilizing a 26 pin SOJ package.

FIG. 2 is a pinout of a $4M \times 1$ DRAM utilizing a 26 pin SOJ package.

FIG. 3 is a pinout of a 4M DRAM utilizing a 26 pin SOJ package, showing pin definitions for $\times 1/\times 4$ options, according to the invention.

DETAILED DESCRIPTION OF THE INVENTION

The described embodiment of the present invention is a dynamic random access memory using lead pins of a package pinout to provide programmability with respect to the mode of operation. The choice of a dynamic random access memory is provided for exemplary purposes only and is not to be construed as limiting the invention to use in DRAMS, random access memories or memories at all. The present invention is equally applicable to any integrated circuit to provide mode programmability at the point of use.

FIGS. 1 and 2 show package pinouts of existing 4M DRAMs without mode programmability. The 4M DRAMs utilize 26 pin SOJ packages. FIG. 3 discloses a package pinout of a 4M DRAM with options for mode programmability according to one embodiment of the invention. The 4M DRAM, according to this embodiment of the invention, uses a 26 pin SOJ package. FIG. 3 discloses pin definitions for the $\times 1/\times 4$ options. Three lead pins are used to provide programmability with respect to the mode of operation of the dynamic random access memory. Note the utilization of lead pins 6, 8 and 21.

Figure 4:
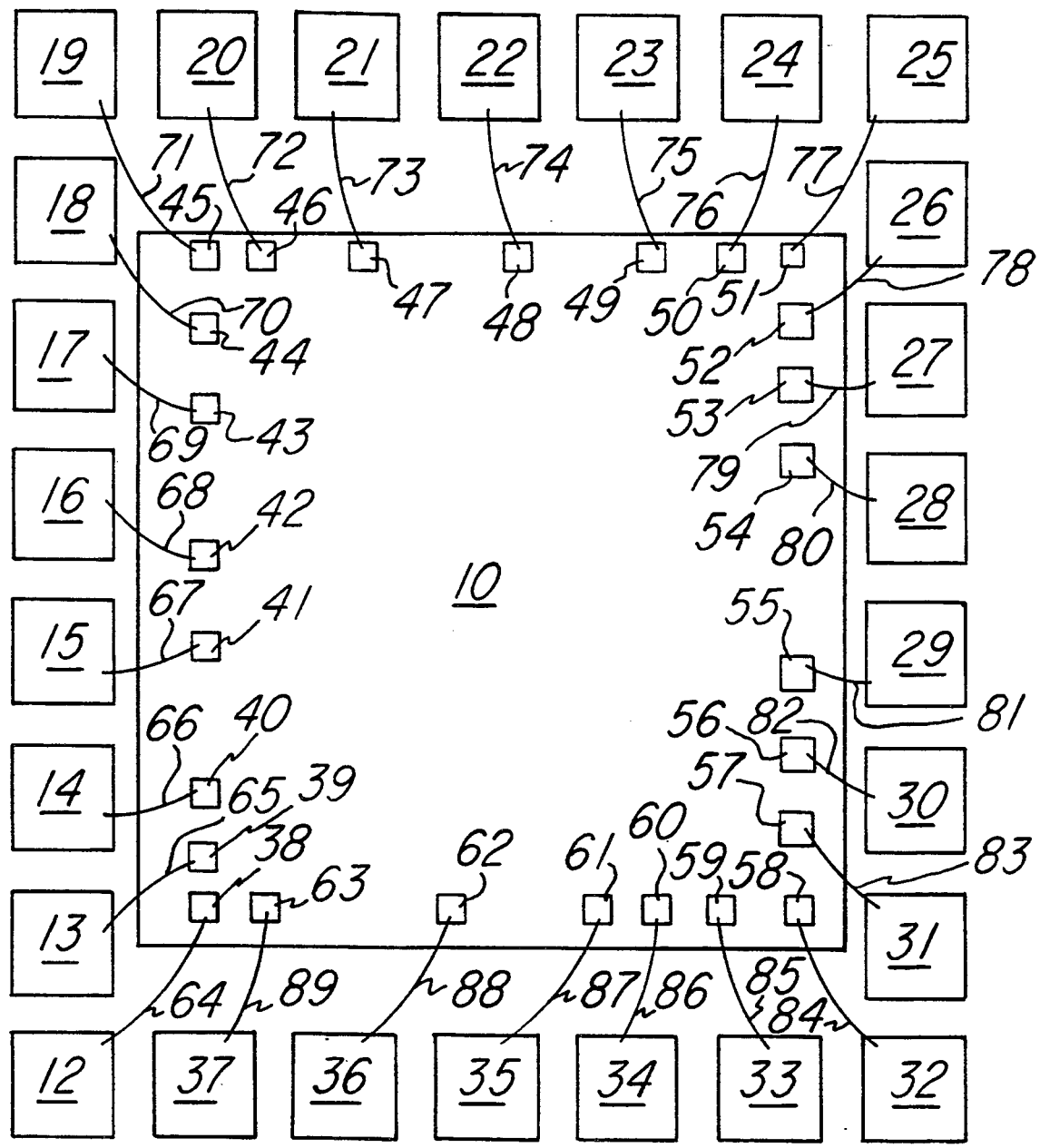
FIG. 4 is a schematic diagram showing an integrated circuit situated in a lead frame with its bond pads schematically connected to the lead pads of the lead frame.

FIG. 4 is a schematic diagram showing the positioning of an integrated circuit 10 between the lead frame lead pads 12–37. These lead pads are connected to bond pads 38–60 and programming bond pads 61–63 by bonding wires 64 through 89. The signals provided to bond pads 38 through 60 are the normal signals utilized in an integrated circuit of the type of integrated circuit 10. In this example, integrated circuit 10 is a dynamic random access memory and signals such as address signals, data output signals, row address strobe and column address strobe are provided via these bond pads. Programming bond pads 61–63 are connected to lead pads 35–37, respectively. Lead pads 35–37 extend (not shown) into lead pins 21, 6 and 8, respectively, of the DRAM of FIG. 3.

After the integrated circuit is mounted onto a lead frame and the bond wires are formed, the entire assembly is encapsulated in plastic (not shown) by injection molding excepting the ends of the lead frame which form the lead pins for connection to the circuit board (not shown). In a preferred embodiment, these lead pins form two in-line rows. This is known in the industry as a "dual in-line package" and is a standard package. For this embodiment of the invention, a 26 pin SOJ package is utilized. Of course, many other types of packages may be suitably used such as ceramic packaging or surface mounting techniques.

Figure 5:
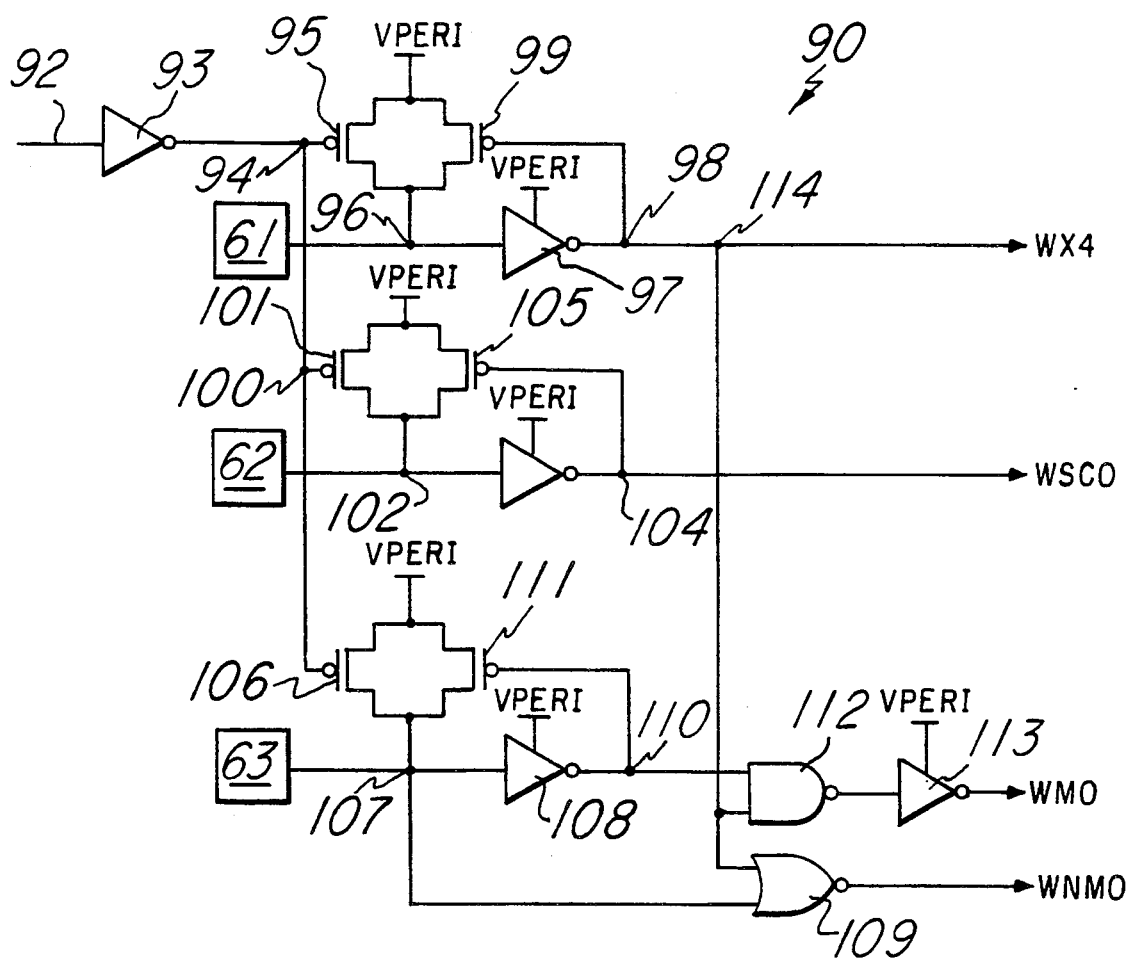
FIG. 5 is a schematic diagram showing the programming mode circuitry on the integrated circuit of one embodiment of the invention.
Figure 6:
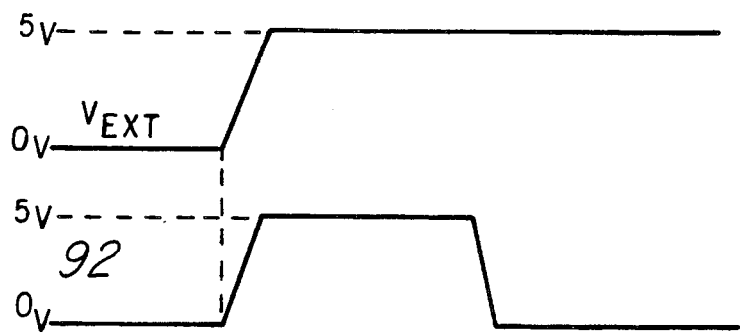
FIG. 6 is a graph of the relationship between $V_{EXT}$ and the power-up signal.

FIG. 5 is a schematic diagram of mode programming circuitry 90 connected to programming bond pads 61–63. Signal line 92 receives a power-up signal (e.g. 5 v) generated by an on-chip circuit (not shown) in response to an externally generated supply voltage ($V_{EXT}$) going high (e.g. 5 v). The power-up signal goes high and tracks the externally generated supply voltage ($V_{EXT}$) for a period of time and then returns to a low voltage level, as can be seen in FIG. 6.

In FIG. 5, signal line 92 is connected to the input of inverter 93. Node 94 couples the output of inverter 93 to the gate of p-channel transistor 95. One source/drain of transistor 95 is connected to on-chip internal voltage supply $V_{PERI}$. The other source/drain of transistor 95 is connected to node 96. Node 96 couples bond pad 61 to the input of inverter 97. The output of inverter 97 is connected to node 98. One source/drain of transistor 99 is connected to on-chip internal voltage supply $V_{PERI}$. The other source/drain of transistor 99 is connected to node 96. The gate of transistor 99 is connected to node 98. Node 98 is also coupled to circuitry (not shown) that sets the DRAM to a ×1 or ×4 organization.

Node 100 couples node 94 to the gate of p-channel transistor 101. One source/drain of transistor 101 is connected to on-chip internal voltage supply $V_{PERI}$. The other source drain of transistor 101 is connected to node 102. Node 102 couples bond pad 62 to the input of inverter 103. The output of inverter 103 is connected to node 104. One source/drain of transistor 105 is connected to on-chip internal voltage supply $V_{PERI}$. The other source/drain of transistor 105 is connected to node 102. The gate of transistor 105 is connected to node 104. Node 104 is also coupled to circuitry (not shown) that sets the DRAM to the Page/Nibble mode or to the SCD (Static Column Decode) mode.

The gate of transistor 106 is connected to node 100. One source/drain of transistor 106 is connected to on-chip internal voltage supply $V_{PERI}$. The other source/drain of transistor 106 is connected to node 107. Node 107 couples bond pad 63 to the input of inverter 108 and to an input of NOR gate 109. The output of NOR gate 109, when high (logic 1), is coupled to circuitry (not shown) that sets the Nibble mode option. The output of inverter 108 is connected to node 110. One source/drain of transistor 111 is connected to on-chip internal voltage supply $V_{PERI}$. The other source/drain of transistor 111 is connected to node 107. The gate of transistor 111 is connected to node 110. Node 110 is also connected to an input of NAND gate 112. The output of NAND gate 112 is connected to the input of inverter 113. The output of inverter 113 is coupled to circuitry (not shown) that sets the Write Mask mode option (WMO). A second input of NOR gate 109 and a second input of NAND gate 112 are together coupled to node 114.

The power-up signal is transmitted on signal line 92 when $V_{EXT}$ goes high. The power-up signal tracks $V_{EXT}$ for a period of time and then returns to a low voltage level. Inverter 93 inverts the power-up signal and the inverted signal is applied to the gates of transistors 95, 101 and 106. Transistors 95, 101 and 106 will turn on with a low gate voltage. The gate voltages will be low only when the power-up signal at the input of inverter 93 is high. When transistors 95, 101 and 106 turn on, $V_{PERI}$ volts is applied to the input of inverters 97, 103 and 108, respectively. Inverters 97, 103 and 108 invert the high voltage signal to a low voltage signal and output the low voltage signal to nodes 98, 104 and 110, respectively.

A low voltage signal on node 98 is transmitted to the gate of transistor 99, to the second inputs of NAND gate 112 and NOR gate 109 and to the organization circuitry by way of lead W×4. A low gate voltage turns on p-channel transistor 99. When transistor 99 turns on, $V_{PERI}$ volts are applied to the input of inverter 97. Transistor 95 must remain on until transistor 99 turns on. After the power-up signal goes low and transistor 95 turns off, feedback voltage will maintain transistor 99 on. A low voltage signal on node 98 provides the control signal that sets the DRAM to a ×1 organization.

If bond pad 61 is shorted to ground Vss external to the package, however, device 95 is of sufficient impedance that it cannot take node 96 above the threshold of inverter 97. Node 98 will thus go to $V_{PERI}$ during the power-up period. This sets the device internally into a ×4 configuration. After the power-up pulse, node 98 remains set high so that no power is consumed through device 99. Thus the power-up signal works in conjunction with the programming circuitry 90 to internally set the DRAM organization.

A low voltage signal on node 104 is transmitted to the gate of transistor 105 and by way of lead WSCO to the internal DRAM circuitry (not shown) that sets the DRAM to the Page/Nibble mode or the SCD (Static Column Decode) mode. A low gate voltage turns on p-channel transistor 105. When transistor 105 turns on, $V_{PERI}$ volts is applied to the input of inverter 103. Transistor 101, which was turned on by the power-up signal must remain on until transistor 105 turns on. After the power-up signal goes low and transistor 101 turns off, feedback voltage will maintain transistor 105 on. A low voltage signal on node 104 provides the control signal that sets the DRAM to the Page/Nibble mode. Contrariwise, a high voltage signal on node 104 provides the control signal that sets the DRAM to the Static Column Decode mode.

A low voltage signal on node 110 is transmitted to the gate of transistor 111 and to an input of NAND gate 112. A low gate voltage turns on p-channel transistor 111. When transistor 111 turns on, $V_{PERI}$ volts is applied to the input of inverter 108. Transistor 106, which was turned on by the power-up signal, must remain on until transistor 111 turns on. After the power-up signal goes low and transistor 106 turns off, feedback voltage will maintain transistor 111 on.

NAND gate 112 outputs a low voltage level in response to high voltage levels on both inputs. The NAND gate outputs a high voltage level in response to all other input voltage combinations. The output of NAND gate 112 is inverted by inverter 113. The output of inverter 113 is coupled to circuitry (not shown) that sets the write mask option (WMO) when the output of inverter 113 is high.

NOR gate 109 outputs a high voltage level in response to low voltage levels on both inputs. The NOR gate outputs a low voltage level in response to all other input voltage combinations. The output of NOR gate 109 is coupled to circuitry (not shown) that sets the Nibble Mode Option (WNMO) when the output of NOR gate 109 is high.

Possible organization and mode programming options for the device of FIG. 5 are listed below in Tables 1 and 2.

TABLE 1

| x1 ORGANIZATIONxOPTION (FIG. 5) | | | |
|---|---|---|---|
| OP3 | OP2 | OP1 | FUNCTION (MODE) |
| open | open | open | x1 Page |
| open | Vss | open | x1 Static Col. Decode (SCD) |
| open | open | Vss | x1 Nibble Mode |
| open | Vss | Vss | not allowed |

TABLE 2

| x4 ORGANIZATION OPTION (FIG. 5) | | | |
|---|---|---|---|
| OP3 | OP2 | OP1 | FUNCTION (MODE) |
| Vss | open | open | x4 Page |
| Vss | Vss | open | x4 Static Col. Decode (SCD) |
| Vss | open | Vss | x4 Page, Write Mask Option WMO |
| Vss | Vss | Vss | x4 SCD, WMO |

Figure 7:
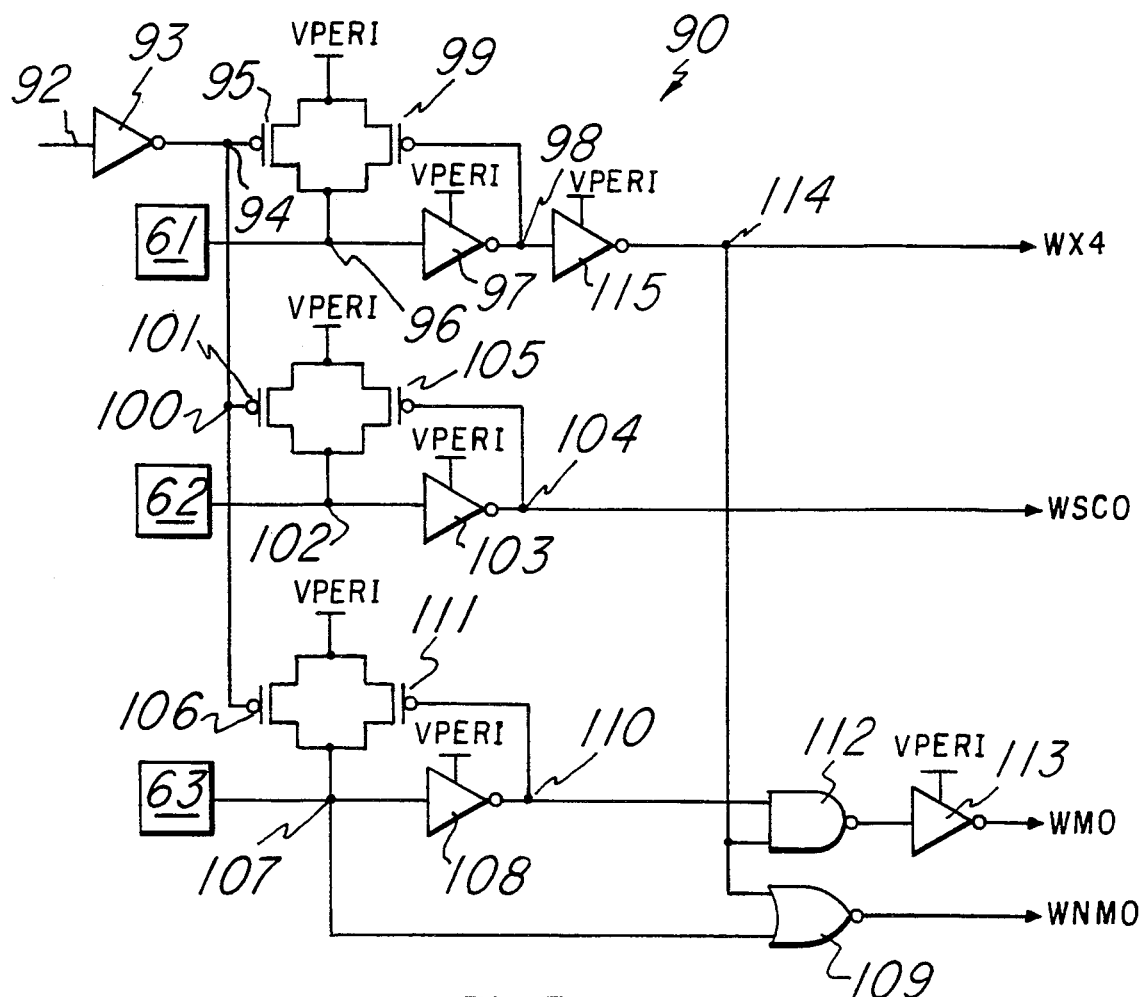
FIG. 7 is a schematic diagram showing the programming mode circuitry on the integrated circuit of another embodiment of the invention.

The embodiment of the invention shown in FIG. 7 is substantially the device of FIG. 5 with the addition of inverter 115 between nodes 98 and 114. The device of FIG. 7 functions in substantially the same manner as the device of FIG. 5 with the one difference being that the level of the control signal being sent to the organizational circuitry is inverted from the level of the control signal in the device of FIG. 5. A high voltage signal on node 98 provides the control signal that sets the DRAM to the x4 organization.

Possible organization and mode programming options for the device of FIG. 7 are listed below in Tables 3 and 4.

TABLE 3

| x1 ORGANIZATIONxOPTION (FIG. 7) | | | |
|---|---|---|---|
| OP3 | OP2 | OP1 | FUNCTION (MODE) |
| Vss | open | open | x1 Page |
| Vss | Vss | open | x1 Static Col. Decode (SCD) |
| Vss | open | Vss | x1 Nibble Mode |
| Vss | Vss | Vss | not allowed |

TABLE 4

| x4 ORGANIZATION OPTION (FIG. 7) | | | |
|---|---|---|---|
| OP3 | OP2 | OP1 | FUNCTION (MODE) |
| open | open | open | x4 Page |
| open | Vss | open | x4 Static Col. Decode (SCD) |
| open | open | Vss | x4 Page, Write Mask Option WMO |
| open | Vss | Vss | x4 SCD, WMO |

Tables 1–4 are self-explanatory. For example in Table 1, if a ×1 DRAM with Enhanced Page Mode is desired using the device of FIG. 5, OP1–OP3 must remain open (e.g. pins 8, 6 and 21 must not be connected to external voltage sources). If a ×4 DRAM with SCD, WMO is desired using the device of FIG. 7, OP1 is left open and OP2 and OP3 are connected to Vss (e.g. pin 8 is not connected to an external voltage source and pins 6 and 21 are connected to Vss). Thus the circuitry allows external sourcing of all device options from a single device.

While this invention has been described with reference to an illustrative embodiment, this description is not intended to be construed in a limiting sense. Various modifications to the illustrative embodiment, as well as other embodiments of the invention will be apparent to persons skilled in the art upon reference to this description. As an example, higher density generations of DRAMs may include wider and wider I/O to facilitate ×4 or ×8 generations and ×8 or ×16 generations. It is therefore contemplated that the appended claims will cover any such modification or embodiments as fall within the true scope of the invention.

What is claimed:

1. A memory control circuit comprising:
 a mode programming circuit connected with a group of programming bonding pads and responsive to signals applied to the programming bonding pads for producing a group of mode signals on output terminals;
 the group of programming bonding pads including first, second and third pads;
 the output terminals including first, second and third terminals;
 when the first, second and third pads are left open, the mode programming circuit produces an ×1 mode signal on the first terminal and a page mode signal on the second terminal;
 when the first and third pads are left open and the second pad is held at a voltage $V_{ss}$, the mode programming circuit produces the ×1 mode signal on the first terminal and a static column decode mode signal on the second terminal; and
 when the second and third pads are left open and the first pad is held at the voltage $V_{ss}$, the mode programming circuit produces the ×1 mode signal on the first terminal and nibble mode signals on the second and third terminals.

2. A memory control circuit comprising:
 a mode programming circuit connected with a group of programming bonding pads and responsive to signals applied to the programming bonding pads for producing a group of mode signals on output terminals;
 the group of programming bonding pads including first, second and third pads;
 the output terminals including first, second and third terminals;

when the first and second pads are left open and the third pad is held at a voltage $V_{ss}$, the mode programming circuit produces an ×4 mode signal on the first terminal and a page mode signal on the second terminal;

when the first pad is left open and the second and third pads are held at the voltage $V_{ss}$, the mode programming circuit produces the ×4 mode signal on the first terminal and a static column decode mode signal on the second terminal;

when the second pad is left open and the first and third pads are held at the voltage $V_{ss}$, the mode programming circuit produces the ×4 mode signal on the first terminal, the page mode signal on the second terminal, and the write mask option mode signal on the third terminal; and when the first, second and third pads are held at the voltage $V_{ss}$, the mode programming circuit produces the ×4 mode signal on the first terminal, a static column decode mode signal on the second terminal, and the write mask option mode signal on the third terminal.

3. A memory control circuit comprising:

a mode programming circuit connected with a group of programming bonding pads and responsive to signals applied to the programming bonding pads for producing a group of mode signals on output terminals;

the group of programming bonding pads including first, second and third pads;

the output terminals including first, second and third terminals;

when the first and second pads are left open and the third pad is held at a voltage $V_{ss}$, the mode programming circuit produces an ×1 mode signal on the first terminal and a page mode signal on the second terminal;

when the first pad is left open and the second and third pads are held at the voltage $V_{ss}$, the mode programming circuit produces the ×1 mode signal on the first terminal and a static column decode signal on the second terminal; and when the second pad is left open and the first and third pads are held at the voltage $V_{ss}$, the mode programming circuit produces the ×1 mode signal on the first terminal and nibble mode signals on the second and third terminals.

4. A memory control circuit comprising:

a mode programming circuit connected with a group of programming bonding pads and responsive to signals applied to the programming bonding pads for producing a group of mode signals on output terminals;

the group of programming bonding pads including first, second and third pads;

the output terminals including first, second and third terminals;

when the first, second and third pads are left open, the mode programming circuit produces an ×4 mode signal on the first terminal and a page mode signal on the second terminal;

when the first and third pads are left open and the second pad is held at a voltage $V_{ss}$, the mode programming circuit produces the ×4 mode signal on the first terminal and a static column decode mode signal on the second terminal;

when the second and third pads are left open and the first pad is held at the voltage $V_{ss}$, the mode programming circuit produces the ×4 mode signal on the first terminal, the page mode signal on second terminal and a write mask option mode signal on the third terminal; and when the third pad is left open and the first and second pads are held at the voltage $V_{ss}$, the mode programming circuit produces the ×4 mode signal on the first terminal, the static column decode mode signal on the second terminal and a write mask option mode signal on the third terminal.

* * * * *